(12) United States Patent
Gouk et al.

(10) Patent No.: US 10,777,405 B2
(45) Date of Patent: Sep. 15, 2020

(54) DRYING PROCESS FOR HIGH ASPECT RATIO FEATURES

(71) Applicant: Applied Materials, Inc., Santa Clara, CA (US)

(72) Inventors: Roman Gouk, San Jose, CA (US); Han-Wen Chen, San Mateo, CA (US); Steven Verhaverbeke, San Francisco, CA (US); Jean Delmas, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/268,162

(22) Filed: Sep. 16, 2016

(65) Prior Publication Data

US 2017/0098541 A1 Apr. 6, 2017

Related U.S. Application Data

(60) Provisional application No. 62/236,913, filed on Oct. 4, 2015.

(51) Int. Cl.
*H01L 21/02* (2006.01)
*B08B 7/00* (2006.01)
(Continued)

(52) U.S. Cl.
CPC ...... *H01L 21/02101* (2013.01); *B08B 7/0021* (2013.01); *B08B 7/0035* (2013.01);
(Continued)

(58) Field of Classification Search
None
See application file for complete search history.

(56) References Cited

U.S. PATENT DOCUMENTS 5,417,768 A  5/1995  Smith, Jr. et al.
5,968,273 A  10/1999  Kadomura et al.
(Continued)

FOREIGN PATENT DOCUMENTS

CN  1958177 A  5/2007
CN  1960813 A  5/2007
(Continued)

OTHER PUBLICATIONS

International Search Report & Written Opinion dated Mar. 17, 2014 for Application No. PCT/US2013/071314.
(Continued)

*Primary Examiner* — Katelyn B Whatley
(74) *Attorney, Agent, or Firm* — Patterson + Sheridan LLP (57) ABSTRACT

A method for processing a substrate is disclosed. The method includes delivering a solvent to a processing chamber and delivering a substrate to the processing chamber. The amount of solvent present in the processing chamber may be configured to submerse the substrate. Liquid $CO_2$ may be delivered to the processing chamber and the liquid $CO_2$ may be mixed with the solvent. Additional liquid $CO_2$ may be delivered to the processing chamber in an amount greater than a volume of the processing chamber to displace the solvent. The liquid $CO_2$ may be phase transitioned to supercritical $CO_2$ in the processing chamber and the substrate may be dried by isothermally depressurizing the processing chamber and exhausting gaseous $CO_2$ from the processing chamber.

17 Claims, 5 Drawing Sheets

(51) Int. Cl.
  *H01L 21/67* (2006.01)
  *F26B 5/04* (2006.01)
  *F26B 21/14* (2006.01)
(52) U.S. Cl.
  CPC .............. *F26B 5/04* (2013.01); *F26B 21/14* (2013.01); *H01L 21/02057* (2013.01); *H01L 21/02063* (2013.01); *H01L 21/67034* (2013.01)

(56) References Cited

U.S. PATENT DOCUMENTS

| | | |
|---|---|---|
| 6,168,668 B1 | 1/2001 | Yudovsky |
| 6,216,364 B1 | 4/2001 | Tanaka et al. |
| 6,286,231 B1 | 9/2001 | Bergman et al. |
| 6,306,564 B1 | 10/2001 | Mullee |
| 6,334,266 B1 | 1/2002 | Moritz et al. |
| 6,508,259 B1 | 1/2003 | Tseronis et al. |
| 6,562,146 B1 | 5/2003 | DeYoung et al. |
| 6,745,494 B2 | 6/2004 | Bergman et al. |
| 6,764,552 B1 | 7/2004 | Joyce et al. |
| 6,793,836 B2 | 9/2004 | Tsung-Kuei et al. |
| 6,843,855 B2 | 1/2005 | Verhaverbeke |
| 6,848,458 B1 | 2/2005 | Shrinivasan et al. |
| 7,000,621 B1 | 2/2006 | Verhaverbeke |
| 7,384,484 B2 | 6/2008 | Muraoka et al. |
| 2001/0004478 A1 | 6/2001 | Zhao et al. |
| 2002/0195121 A1 | 12/2002 | Kittle |
| 2003/0022487 A1 | 1/2003 | Yoon et al. |
| 2003/0026677 A1 | 2/2003 | Sakashita et al. |
| 2003/0075536 A1 | 4/2003 | Mack et al. |
| 2003/0084918 A1 | 5/2003 | Kim |
| 2003/0102017 A1 | 6/2003 | Taniyama |
| 2004/0072706 A1 | 4/2004 | Arena-Foster et al. |
| 2004/0198066 A1 | 10/2004 | Verhaverbeke |
| 2005/0191861 A1 | 9/2005 | Verhaverbeke |
| 2005/0242064 A1 | 11/2005 | Saito et al. |
| 2006/0223899 A1 | 10/2006 | Hillman et al. |
| 2007/0221252 A1 | 9/2007 | Kiyose |
| 2007/0287277 A1 | 12/2007 | Kolics et al. |
| 2007/0295365 A1 | 12/2007 | Miya et al. |
| 2008/0021261 A1 | 1/2008 | Hamsund |
| 2008/0153276 A1 | 6/2008 | Hwang et al. |
| 2008/0210261 A1* | 9/2008 | Nagami ............ H01L 21/67028 134/21 |
| 2008/0224379 A1 | 9/2008 | McNamara |
| 2009/0151754 A1 | 6/2009 | Zhu et al. |
| 2011/0146909 A1 | 6/2011 | Shih et al. |
| 2012/0017946 A1* | 1/2012 | Yanagawa ............ F26B 3/04 134/26 |
| 2012/0055405 A1 | 3/2012 | Koelmel et al. |
| 2012/0085495 A1 | 4/2012 | Lee et al. |
| 2012/0103264 A1 | 5/2012 | Choi et al. |
| 2012/0111379 A1 | 5/2012 | Nixon et al. |
| 2012/0304485 A1* | 12/2012 | Hayashi ............ H01L 21/02057 34/415 |
| 2012/0329290 A1* | 12/2012 | Shimada ............ H01L 21/6719 438/795 |
| 2013/0192628 A1 | 8/2013 | Mori et al. |
| 2013/0194350 A1 | 8/2013 | Watanabe et al. |
| 2013/0224956 A1* | 8/2013 | Negoro ............ H01L 21/31111 438/697 |
| 2013/0302982 A1 | 11/2013 | Tung et al. |
| 2013/0318812 A1 | 12/2013 | Kim et al. |
| 2014/0144462 A1* | 5/2014 | Verhaverbeke ... H01L 21/67034 134/1.2 |
| 2014/0283746 A1 | 9/2014 | Seo et al. |
| 2014/0299162 A1* | 10/2014 | Plavidal ............ B08B 7/0021 134/30 |
| 2015/0221539 A1 | 8/2015 | Ouye |
| 2015/0262859 A1 | 9/2015 | Balasubramanian et al. |

FOREIGN PATENT DOCUMENTS

| | | |
|---|---|---|
| CN | 102386052 A | 3/2012 |
| EP | 1172458 A2 | 1/2002 |
| JP | 2003-51474 A | 2/2003 |
| JP | 2003-282510 A | 10/2003 |
| JP | 2004186526 A | 7/2004 |
| JP | 2004-249189 A | 9/2004 |
| JP | 2005-116759 A | 4/2005 |
| JP | 2005-138063 A | 6/2005 |
| JP | 2005333015 A | 12/2005 |
| JP | 2006-179913 A | 7/2006 |
| JP | 2007-049065 A | 2/2007 |
| JP | 2008-73611 A | 4/2008 |
| JP | 2010-045170 A | 2/2010 |
| JP | 2010-051470 A | 3/2010 |
| JP | 2011-040572 A | 2/2011 |
| JP | 2012-124441 A | 6/2012 |
| JP | 2012-204656 A | 10/2012 |
| JP | 2013-033962 A | 2/2013 |
| JP | 2013-105777 A | 5/2013 |
| JP | 2013-120944 A | 6/2013 |
| JP | 2013-179244 A | 9/2013 |
| JP | 2014-241450 A | 12/2014 |
| KR | 10-0171945 | 3/1999 |
| KR | 10-2005-0032943 A | 4/2005 |
| KR | 10-0730348 B1 | 6/2007 |
| KR | 10-2005-0063720 | 11/2007 |
| KR | 10-2007-0113096 | 11/2007 |
| KR | 10-2008-0002633 | 1/2008 |
| KR | 10-0822373 B1 | 4/2008 |
| KR | 10-2010-0128123 A | 12/2010 |
| KR | 10-2013-0063761 | 6/2013 |
| KR | 10-2014-0115795 A | 10/2014 |
| TW | 201426850 A | 7/2014 |
| TW | 201534407 A | 9/2015 |
| WO | 2010/036575 A2 | 4/2010 |
| WO | 2011/103062 A2 | 8/2011 |
| WO | 2012133583 A1 | 10/2012 |

OTHER PUBLICATIONS

International Search Report and Written Opinion of related application PCT/US2016/051520 dated Dec. 26, 2016.
International Search Report and Written Opinion, PCT/US2015/039974, dated Oct. 29, 2015.
International Search Report and Written Opinion for related application PCT/US2016/051582 dated Dec. 22, 2016.
International Search Report and Written Opinion for International Application No. PCT/US2016/051480 dated Jan. 5, 2017.
Taiwan Office Action in related application TW 102140520 dated Apr. 17, 2017.
Search Report for Taiwan Application No. 105131202 dated Feb. 22, 2019.
Office Action for Japanese Application No. 2018-546484 dated Oct. 8, 2019.
Search Report for Taiwan Application No. 105130171 dated Jul. 9, 2019.
Office Action for Japanese Application No. 2018-517340 dated Apr. 9, 2019.
Search Report for Taiwan Application No. 105131243 dated Aug. 19, 2019.
Office Action for Japanese Application No. 2018-517285 dated Mar. 26, 2019.
Office Action for Korean Application No. 10-2018-7012657 dated May 21, 2019.
Office Action for Korean Application No. 10-2018-7012655 dated May 21, 2019.
Office Action for Korean Application No. 10-2018-7012656 dated May 21, 2019.
Office Action for Japanese Application No. 2018-517344 dated Jun. 4, 2019.
Search Report for Taiwan Application No. 108125950 dated Oct. 18, 2019.

(56) References Cited

OTHER PUBLICATIONS

Office Action for Japan Application No. 2018-517285 dated Oct. 23, 2019.

* cited by examiner

DRYING PROCESS FOR HIGH ASPECT RATIO FEATURES

CROSS-REFERENCE TO RELATED APPLICATIONS

This application claims priority to U.S. Provisional Patent Application No. 62/236,913, filed Oct. 4, 2015, the entirety of which is herein incorporated by reference.

BACKGROUND

Field

Embodiments of the present disclosure generally relate to a substrate cleaning and drying processes. More specifically, embodiments described herein relate to a drying process for high aspect ratio features.

Description of the Related Art

In the cleaning of semiconductor devices, it is often desirable to remove liquid and solid contaminants from surfaces of a substrate, thus leaving clean surfaces. Wet cleaning processes generally involve the use of cleaning liquids, such as aqueous cleaning solutions. After wet cleaning the substrate, it is often desirable to remove the cleaning liquid from the surface of the substrate in a cleaning chamber.

Most current wet cleaning techniques utilize a liquid spraying or immersion step to clean the substrate. Drying of the substrate that has high aspect ratio features or low-k materials which have voids or pores is very challenging subsequent to the application of a cleaning liquid. Capillary forces of the cleaning liquid often cause deformation of materials in these structures which can create undesired stiction, which can damage the semiconductor substrate in addition to leaving residue on the substrate from the cleaning solution utilized. The aforementioned challenges are especially apparent on substrates with high-aspect-ratio semiconductor device structures during subsequent drying of the substrate. Line stiction, or line collapse, results from bending of the side walls, which form the high-aspect-ratio trench or via, towards each other due to capillary pressure across the liquid-air interface over the liquid trapped in the trench or via during the wet cleaning process(es). Features with narrow line width and high-aspect-ratios are especially susceptible to the difference in surface tension created between liquid-air and liquid-wall interfaces due to capillary pressure, which is also sometimes referred to as capillary force. Current workable drying practices are facing a steeply rising challenge in preventing line stiction as a result of rapid device scaling advancements.

As a result, there is a need in the art for improved methods for performing cleaning and supercritical drying processes.

SUMMARY

In one embodiment, a substrate processing method is provided. The method includes delivering a solvent to a processing chamber and delivering a substrate to the processing chamber. The amount of solvent present in the processing chamber may be configured to submerse the substrate. Liquid $CO_2$ may be delivered to the processing chamber and the liquid $CO_2$ may be mixed with the solvent. Additional liquid $CO_2$ may be delivered to the processing chamber in an amount greater than a volume of the processing chamber to displace the solvent. The liquid $CO_2$ may be phase transitioned to supercritical $CO_2$ in the processing chamber and the substrate may be dried by isothermally depressurizing the processing chamber and exhausting gaseous $CO_2$ from the processing chamber.

In another embodiment, a substrate processing method is provided. The method includes delivering a solvent to a processing chamber and delivering a substrate to the processing chamber. The amount of solvent present in the processing chamber may be configured to submerse the substrate. Supercritical $CO_2$ may be delivered to the processing chamber and the supercritical $CO_2$ may be mixed with the solvent. Additional supercritical $CO_2$ may be delivered to the processing chamber in an amount greater than a volume of the processing chamber to displace the solvent. The substrate may be dried by isothermally depressurizing the processing chamber and exhausting gaseous $CO_2$ from the processing chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the following description, for purposes of explanation, numerous specific details are set forth in order to provide a thorough understanding of the embodiments provided herein. However, it will be evident to one skilled in the art that the present disclosure may be practiced without these specific details. In other instances, specific apparatus structures have not been described so as not to obscure embodiments described. The following description and figures are illustrative of the embodiments and are not to be construed as limiting the disclosure.

Figure 1:
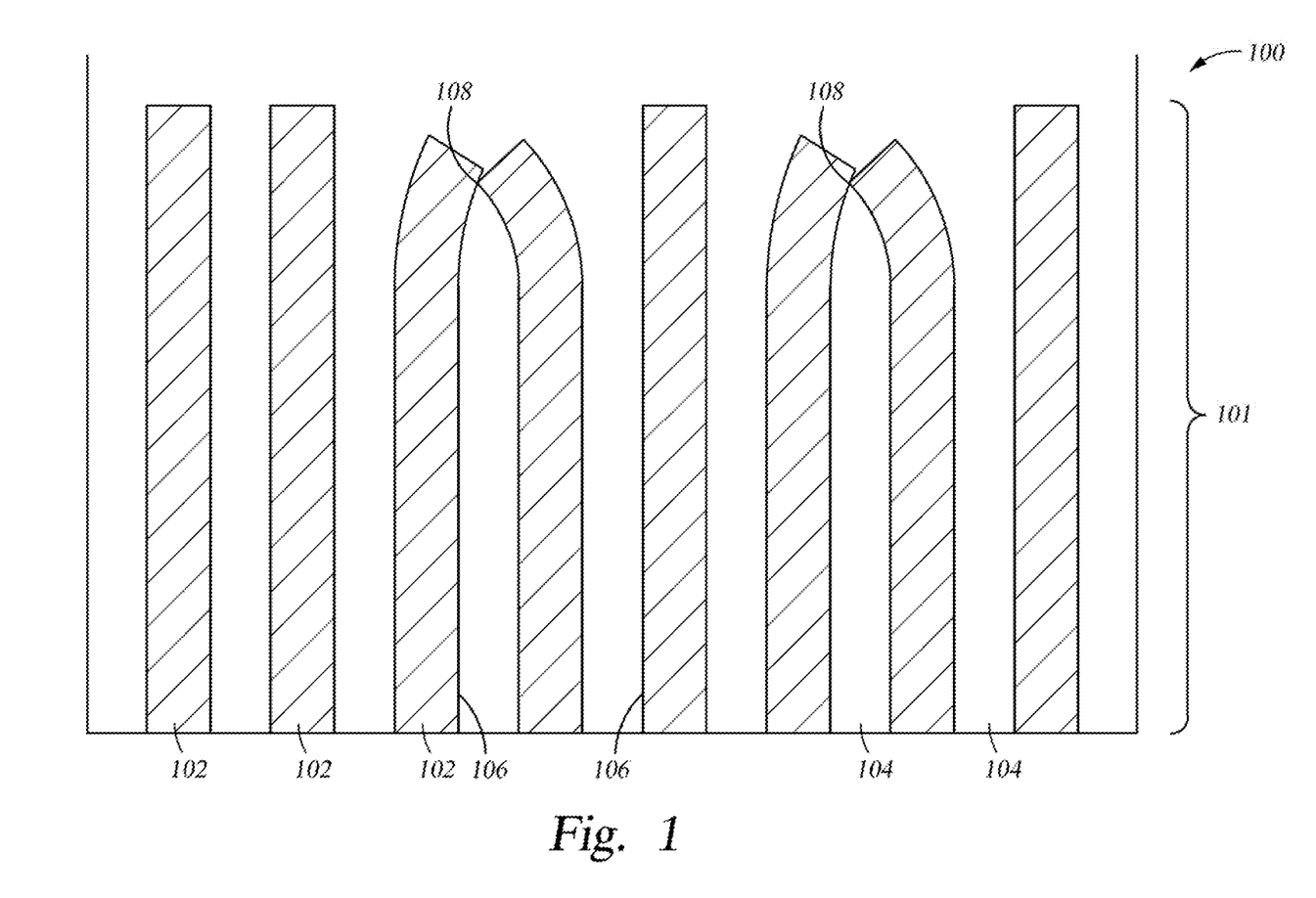
FIG. 1 illustrates the effect of stiction created between features formed on a semiconductor substrate according to embodiments described herein.

FIG. 1 is a schematic cross-sectional view that illustrates a portion of a semiconductor device 100 in which line stiction has occurred between two features within the semiconductor device 100. As shown, the high aspect ratio device structures are formed on a surface of a substrate.

During processing, device structures 102 should remain in a vertical orientation and walls 106 should not cross the openings 104 and contact adjacent walls 106 of the device structures 102. When the semiconductor device 100 is being dried after being cleaned with wet chemistries, the walls 106 of the device structures 102 are subjected to capillary forces due to the air-liquid interface created by the cleaning liquid disposed within the opening 104. The capillary forces cause the walls 106 of adjacent device structures 102 to bend towards one another and contact each other. Line stiction results from the contact between walls 106 of adjacent device structures 102, ultimately causing closure of the openings 104. Line stiction is generally undesirable because it prevents access to the openings 104 during subsequent substrate processing steps, such as further deposition steps.

To prevent line stiction, a substrate may be exposed to an aqueous cleaning solution, such as de-ionized water or cleaning chemicals, in a wet clean chamber. Such a substrate includes a semiconductor substrate having electronic devices disposed or formed thereon. The use of the aqueous cleaning solutions on the substrate in a wet clean chamber removes residues left on the substrate after the wet cleaning processes have been performed. In some configurations, the wet clean chamber may be a single wafer cleaning chamber and/or a horizontal spinning chamber. Additionally, the wet clean chamber may have a megasonic plate adapted to generate acoustic energy directed onto the non-device side of the substrate.

After wet cleaning the substrate, the substrate may be transferred to a solvent exchange chamber to displace any previously used aqueous cleaning solutions used in the wet clean chamber. The substrate may then be transferred to a supercritical fluid chamber for further cleaning and drying steps to be performed on the substrate. In one embodiment, drying the substrate may involve the delivery of a supercritical fluid to a surface of the substrate. A drying gas may be selected to transition into a supercritical state when subjected to certain pressure and temperature configurations that are achieved or maintained in the supercritical processing chamber. One example of such a drying gas includes carbon dioxide ($CO_2$). Since supercritical $CO_2$ is a supercritical gas, it has no surface tension in that its surface tension is similar to a gas, but has densities that are higher than those of a gas. Supercritical $CO_2$ has a critical point at a pressure of about 73.0 atm and a temperature of about 31.1° C. One unique property of a supercritical fluid, such as $CO_2$, is that condensation will not occur at any pressure above the supercritical pressure and temperatures above the supercritical point (e.g., 31.1° C. and 73 atm for $CO_2$). Critical temperature and critical pressure parameters of a processing environment, such as a processing chamber, influence the supercritical state of the $CO_2$ drying gas.

The supercritical fluid, due to its unique properties, may penetrate substantially all pores or voids in the substrate and remove any remaining liquids or particles that may be present in the openings 104. In one embodiment, after the supercritical processing has proceeded for a desired period of time to remove particles and residues, the pressure of the chamber is decreased at a nearly constant temperature, allowing the supercritical fluid to transition directly to a gaseous phase within the openings 104. Liquids typically present in the openings 104 prior to supercritical fluid treatment may be displacement solvents from the solvent exchange chamber. Particles typically present in the openings 104 may be any solid particulate matter, such as organic species (i.e., carbon), inorganic species (i.e. silicon), and/or metals. Examples of openings 104 that may be dried by supercritical fluid include voids or pores in a dielectric layer, voids or pores in a low-k dielectric material, and other types of gaps in the substrate that may trap cleaning fluids and particles. Moreover, supercritical drying may prevent line stiction by bypassing the liquid state during phase transition and eliminating capillary forces created between the walls 106 of the device structures 102 due to the due to the negligible surface tension of supercritical fluid, such as supercritical $CO_2$.

The substrate may then be transferred from the supercritical fluid chamber to a post processing chamber. The post processing chamber may be a plasma processing chamber, in which contaminants that may be present on the substrate may be removed. Post processing the substrate may also further release any line stiction present in the device structures. The processes described herein are useful for cleaning device structures having high aspect ratios, such as aspect ratios of about 10:1 or greater, 20:1 or greater, or 30:1 or greater. In certain embodiments, the processes described herein are useful for cleaning 3D/vertical NAND flash device structures.

Figure 2A:
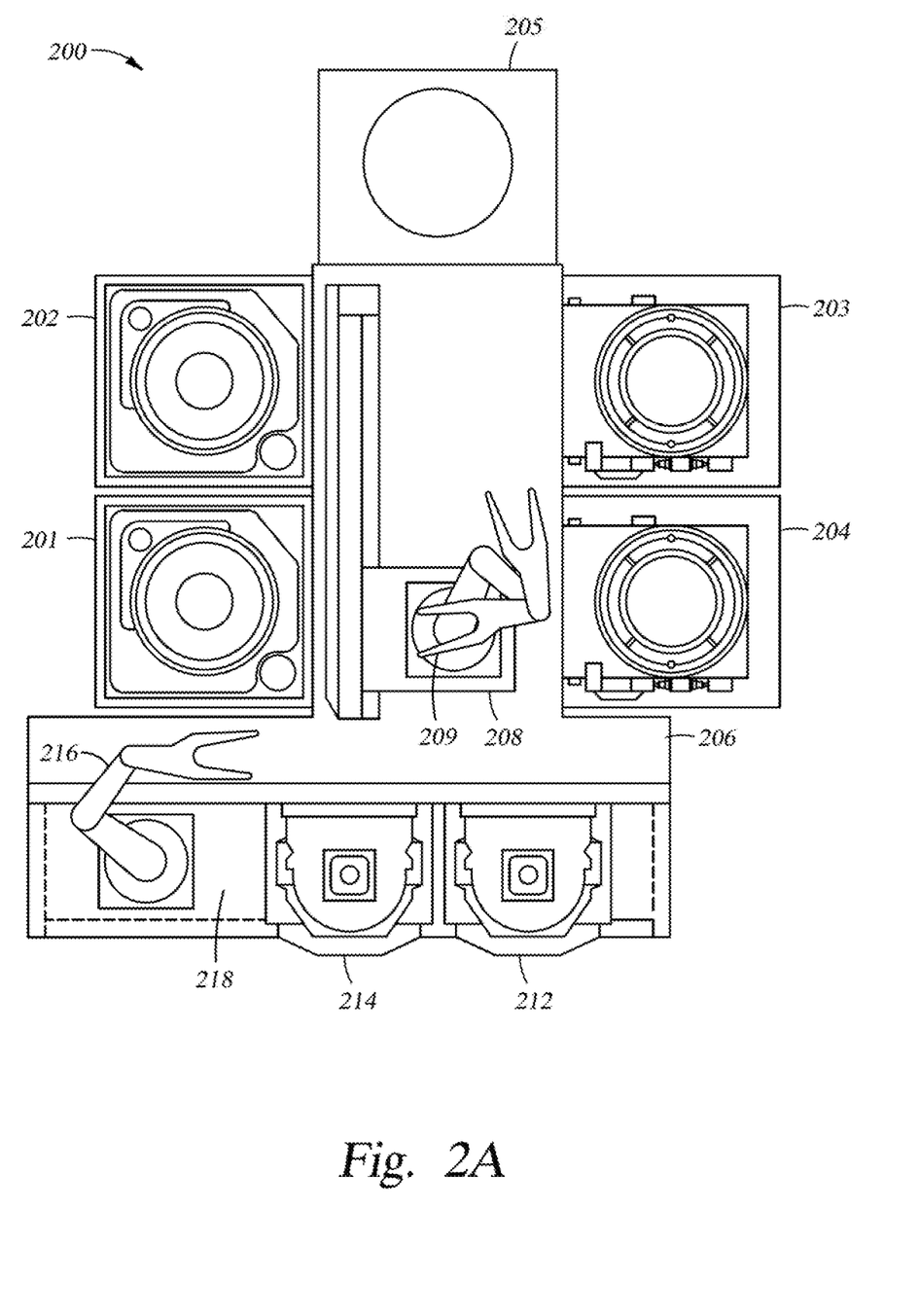
FIG. 2A illustrates a plan view of processing apparatus according to one embodiment described herein.

FIG. 2A illustrates a substrate processing apparatus that may be adapted to perform one or more of the operations described above, according to one embodiment of the present disclosure. In one embodiment, the processing apparatus 200 comprises a wet clean chamber 201, a solvent exchange chamber 202, a supercritical fluid chamber 203, a post processing chamber 204, a transfer chamber 206, and a wet robot 208. Processing a substrate may include, but is not limited to, forming electrical devices such as transistors, capacitors, or resistors, that are interconnected by metal lines, which are insulated by interlayer dielectrics upon the substrate. These processes may include cleaning the substrate, cleaning films formed on the substrate, drying the substrate, and drying films formed on the substrate. In another embodiment, the processing apparatus 200 includes an inspection chamber 205, which may include tools (not shown) to inspect substrates that have been processed in the processing apparatus 200.

In one embodiment, the substrate processing apparatus 200 is a cluster tool comprising several substrate processing chambers, such as the wet clean chamber 201, the solvent exchange chamber 202, the supercritical fluid chamber 203, the post processing chamber 204, and the transfer chamber 206. The chambers 201, 202, 203, 204 may be positioned about the wet robot 208 which may be disposed in the transfer chamber 206. The wet robot 208 comprises a motor, a base, an arm, and an end effector 209 configured to transfer substrates between the chambers. Optionally, the wet robot 208 may have multiple arms and multiple end effectors to increase the throughput of the processing apparatus 200. In one embodiment, the wet robot 208 transfers substrates between the aforementioned chambers. In another embodiment, at least one of the end effectors of the wet robot 208 is a dedicated dry end effector (e.g., adapted to handle dry wafers) and at least one of the end effectors of the wet robot 208 is a dedicated wet end effector (e.g., adapted to handle wet wafers). The dedicated dry end effector may be used to transfer substrates between the supercritical fluid chamber 203 and the post processing chamber 204.

The processing apparatus 200 also comprises a dry robot 216 disposed in a factory interface 218 which may be coupled to the processing apparatus 200 and a plurality of substrate cassettes 212 and 214, each holding a plurality of substrates to be cleaned or dried, or that have been cleaned or dried. The dry robot 216 may be configured to transfer substrates between the cassettes 212 and 214 and the wet clean chamber 201 and post processing chamber 204. In another embodiment, the dry robot 216 may be configured to transfer substrates between the supercritical fluid chamber 203 and the post processing chamber 204. The processing chambers within the processing apparatus 200 may be placed on a horizontal platform which houses the substrate transfer chamber 206. In another embodiment, a portion of the platform may be oriented in a position other than a horizontal orientation.

Figure 2B:
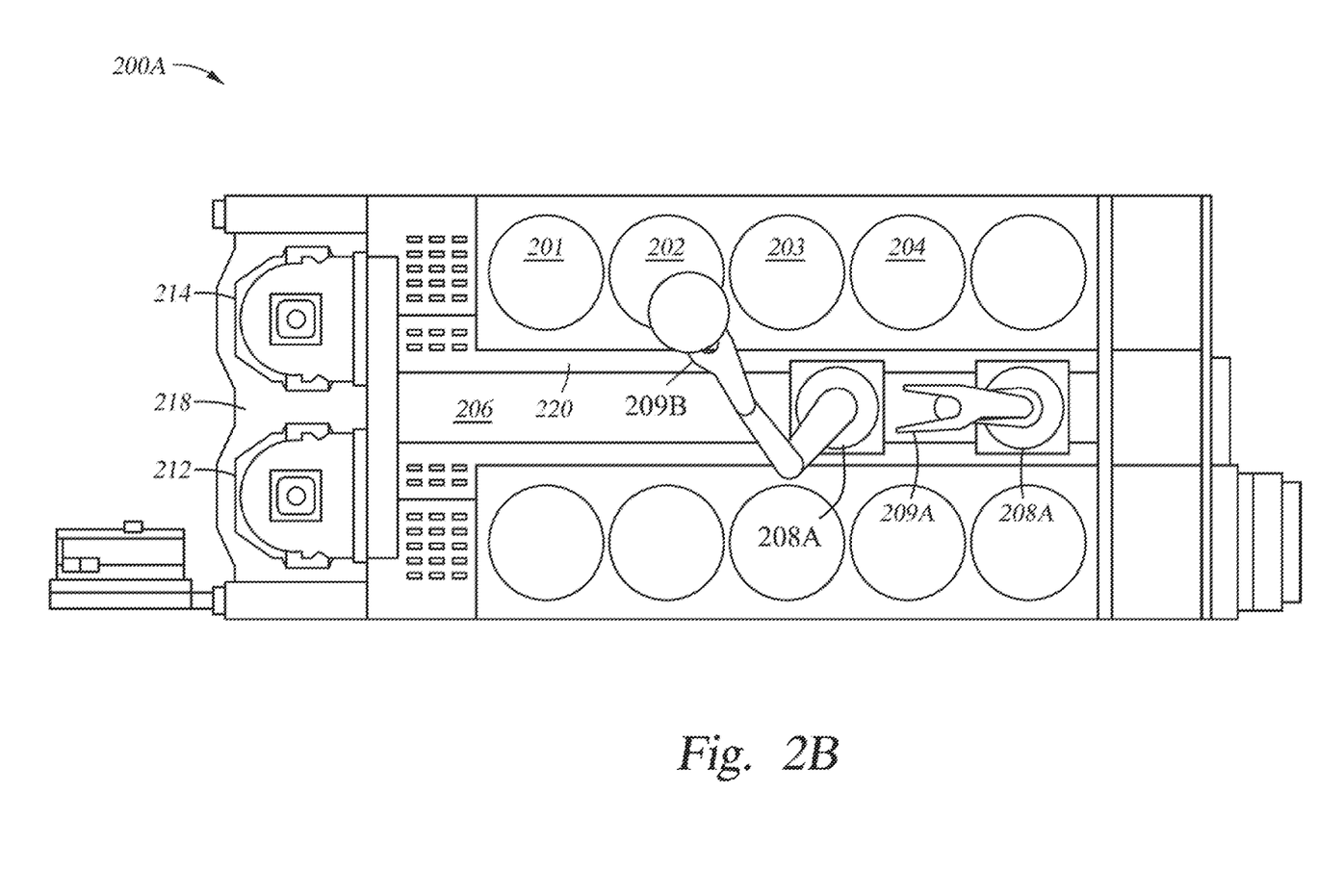
FIG. 2B illustrates a plan view of a processing apparatus according to one embodiment described herein.

In an alternate embodiment, as shown in FIG. 2B, the processing apparatus 200A may be a linear apparatus comprising several substrate processing chambers such as the wet clean chamber 201, the solvent exchange chamber 202, the supercritical fluid chamber 203, the post processing chamber 204, and the transfer chamber 206. For example, the processing apparatus 200A may be the Raider® GT available from Applied Materials, Santa Clara, Calif., however it is contemplated that other processing apparatuses from other manufacturers may be adapted to perform the embodiments described herein.

The chambers 201, 202, 203, 204 may be positioned about a robot 208A which may be disposed in the transfer chamber 206. The robot 208A comprises a motor, a base, an arm, and end effectors 209A and 209B configured to transfer substrates between the chambers. The robot 208A may have multiple arms and multiple end effectors to increase the throughput of the processing apparatus 200A. In one embodiment, the robot 208A, having a dedicated wet end effector 209A, transfers substrates between the aforementioned chambers. The processing apparatus 200A may also comprise a factory interface 218 which may be coupled to the processing apparatus 200 and a plurality of substrate cassettes 212 and 214, each holding a plurality of substrates to be cleaned or dried, or that have been cleaned or dried. The robot 208A having the dedicated dry end effector 209B, transfers substrates between the cassettes 212 and 214 and the wet clean chamber 201 and post processing chamber 204. In one embodiment, the dedicated dry end effector 209B may be configured to transfer substrates between the supercritical fluid chamber 203 and the post processing chamber 204. The chambers within the processing apparatus 200A may be placed on a horizontal platform which houses the substrate transfer chamber 206. In another embodiment, a portion of the platform may be oriented in a position other than a horizontal orientation (See FIG. 5).

In some configurations of the processing apparatus 200A, the robot 208A may travel along a linear track 220. Chambers may be arranged in sequence on one or both sides of the linear track 220. To perform wet substrate transfer, excess liquid may be remove from the substrate, such as by rotating the substrate, while still in the chamber so only a thin wet layer remains on the substrate surface before the robot 208A transfers the substrate. In embodiments providing two or more end effectors on the robot 208A, at least one may be dedicated to wet substrate transfer and the other one may be dedicated to dry substrate transfer. More chambers may be installed in the extendable linear configuration for high-volume production.

The configurations referred to in the previous embodiments greatly reduce design complexities of each chamber, enable queue time control between sensitive process steps, and optimize throughput in continuous production with adjustable chamber module count to equalize process duration of each processing operation.

Figure 3:
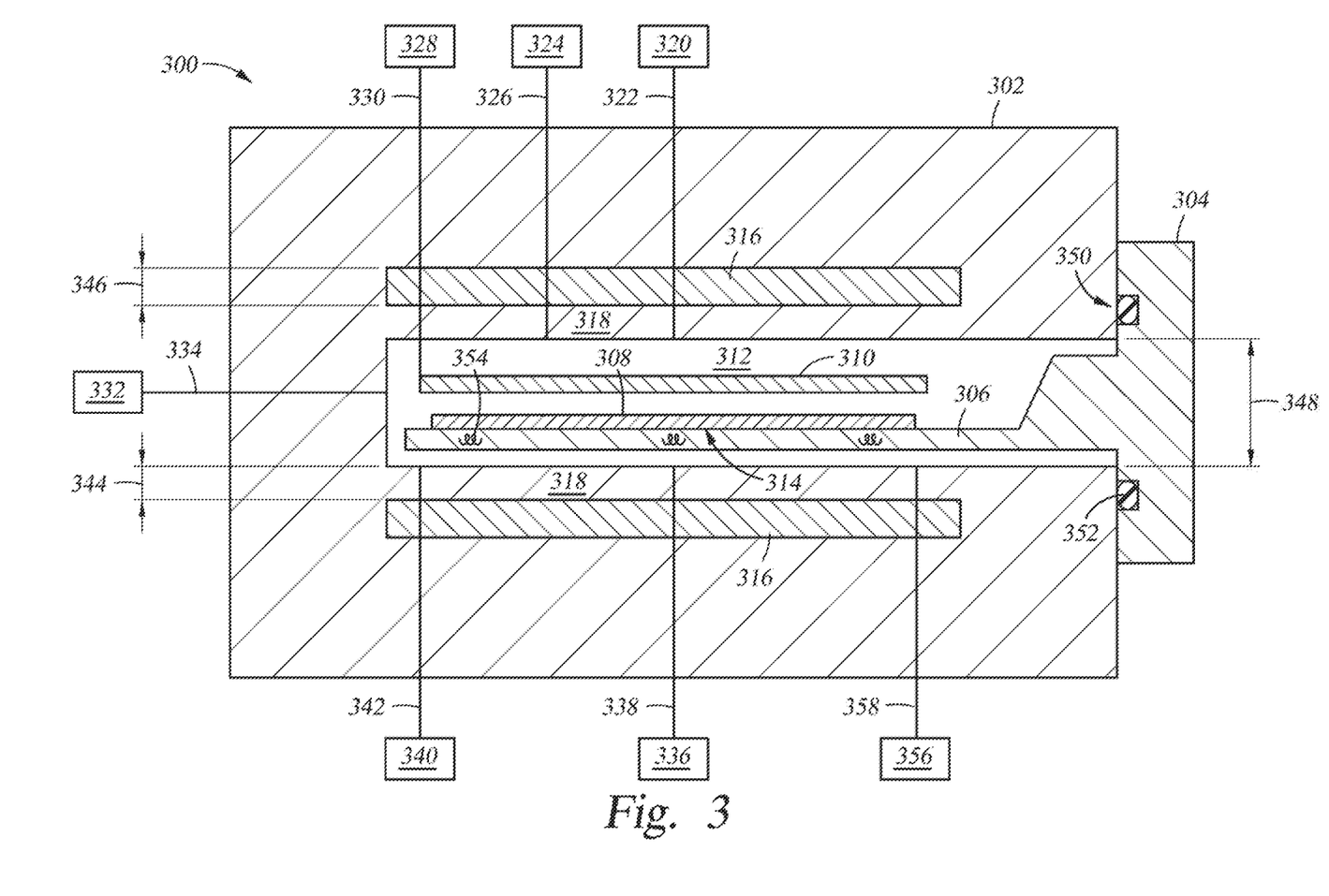
FIG. 3 schematically illustrates a cross-sectional view of a small thermal mass processing chamber according to one embodiment described herein.

FIG. 3 schematically illustrates a cross-sectional view of a small thermal mass processing chamber 300 according to one embodiment described herein. In certain embodiments, the chamber 300 may be implemented as the chamber 203 described with regard to FIG. 2A and FIG. 2B. Generally, the chamber 300 is configured to withstand pressurization suitable for generation and/or maintenance of a supercritical fluid therein. The chamber 300 may also be advantageously cycled within a temperature range suitable for performing phase transitions.

The chamber 300 includes a body 302, a liner 318, and an insulation element 316. The body 302 and the liner 318 generally define a processing volume 312. The body 302 may be configured to withstand pressures suitable for generating a supercritical fluid within the processing volume 312. For example, the body may be suitable for withstanding pressures of about 100 bar or greater. Suitable materials for the body 302 include stainless steel, aluminum, or other high strength metallic materials. The liner 318 may also be formed from materials similar to the body 302. In one embodiment, the liner 318 and the body 302 may be a unitary apparatus. In another embodiment, the liner 318 and the body 302 may be separate apparatus coupled together.

The liner 318, at regions adjacent the processing volume 312, may have a thickness 344 of between about 2 mm and about 5 mm, such as about 3 mm. The relatively minimal amount of material comprising the liner 318 compared to the body 302 causes the liner 318 to have a small thermal mass relative to the thermal mass of the body 302. Accordingly, temperature changes within the processing volume 312 may be made in a more efficient manner as the temperature of the processing volume 312 is influenced predominantly by the liner 318, rather than the body 302. In one embodiment, a processing environment within the processing volume 312 may be cycled between about 20° C. and about 50° C. in an amount of time less than about 5 minutes, for example less than about 1 minute. In one embodiment, the processing volume 312 may be cycled between about 20° C. and about 50° C. in about 30 seconds.

The insulation element 316 is generally disposed within the body 302 adjacent the liner 318. In the illustrated embodiment, the insulation element 316 may be multiple apparatus. The insulation element 316 may general extend along a long axis of the processing volume 312 to further reduce the thermal mass of the liner 318 by insulating the liner 318 from the body 302. The insulation element 316 may be formed form a material suitable for use in a high pressure environment which has a coefficient of thermal expansion similar to the coefficient of thermal expansion for the materials utilized for the body 302 and the liner 318. In one embodiment, the insulation element 316 may be a ceramic material. Various examples of ceramic materials include aluminum oxide, aluminum nitride, silicon carbide, and the like. A thickness 346 of the insulation element 316 may be between about 0.1 inches and about 1.0 inch, such as about 0.5 inches.

The processing volume 312 has a volume of less than about 2 liters, for example, about 1 liter. A distance 348 spanning the processing volume 312 between the liner 318 may be less than about 5 cm, such as less than about 2 cm, for example, about 1 cm. In various embodiments, the processing volume 312 may be filled with various liquids, gases, and/or supercritical fluids depending on the conditions in the processing volume 312. In one embodiment, the processing volume 312 may be coupled to one or more solvent sources 320, 332, 336. A first solvent source 320 may be coupled to the processing volume 312 via a first conduit 322 through a top of the body 302. A second solvent source 332 maybe coupled to the processing volume 312 via a second conduit 334 through a sidewall of the body 302. A third solvent source 336 may be coupled to the processing volume 312 via a third conduit 338 through a bottom of the body 312. The solvent sources 320, 332, 336 may be configured to provide solvents to the processing volume from various entry ports, depending upon desired solvent introduction characteristics.

Suitable solvents which may be supplied to the processing volume 312 from the solvent sources 320, 332, 336 include acetone, isopropyl alcohol, ethanol, methanol, N-Methyl-2-pyrrolidone, N-Methylformamide, 1,3-Dimethyl-2-imidazolidinone, dimethylacetamide, and dimethyl sulfoxide, among others. Generally the solvent may be selected such that the solvent is miscible with liquid $CO_2$.

A first fluid source 324 may be coupled to the processing volume 312 via fourth conduit 326 through the top of the body 302. The first fluid source 324 is generally configured to provide a liquid or supercritical fluid to the processing volume 312. In one embodiment, the first fluid source 324 may be configured to deliver supercritical $CO_2$. In another embodiment, the fluid source 324 may be configured to deliver supercritical $CO_2$ to the processing volume 312. In this embodiment, heating apparatus and pressurization apparatus may be coupled to the fourth conduit 326 to facilitate phase transition of liquid $CO_2$ to supercritical $CO_2$ prior to entry into the processing volume 312. A second fluid source 356 may be similarly configured to the first fluid source 324. However, the second fluid source 356 may be coupled to the processing volume via a fifth conduit 358 through the bottom of the body 302. Delivery of liquid $CO_2$ and/or supercritical $CO_2$ may be selected from a top down (first fluid source 324) or bottom up (second fluid source 356) scheme, depending upon desired processing characteristics.

In operation, temperature of the processing volume 312 may be controlled, at least in part, by the temperature of the $CO_2$ provided to the processing volume 312. Additionally, liquid $CO_2$ and/or supercritical $CO_2$ may be provided to the processing volume 312 in an amount such that the entire processing volume is exchanged between about 1 time and about 5 times, for example, about 3 times. It is believed that repetitive processing volume turnover may facilitate solvent mixing with the $CO_2$ prior to formation of and/or delivery of supercritical $CO_2$ to the processing volume 312 during subsequent supercritical drying operations. To facilitate turnover and removal of fluids and gases from the processing volume 312, the processing volume 312 may be coupled to a fluid outlet 340 via a sixth conduit 342.

The chamber 300 also includes a substrate support 306 which may be coupled to a door 304 and a baffle plate 310 may be movably disposed within the processing volume 312. In one embodiment, the substrate support 306 and the door 304 may be a unitary apparatus. In another embodiment, the substrate 306 may be removably coupled to the door 304 and may move independently of the door 304. The door 304 and the substrate support 306 may be formed from various materials, including stainless steel, aluminum, ceramic material, polymeric materials or combinations thereof. The substrate support 306 may also have a heating element 354 disposed therein. The heating element 354 may be a resistive heater in one embodiment. In another embodiment, the heating element 354 may be a fluid filled channel formed in the substrate support 306. The heating element 354 may be configured to heat the processing volume 312 to facilitate formation or maintenance of a supercritical fluid in the processing volume 312.

In operation, the substrate support 306 may enter the processing volume 312 via an opening formed in the body 302 and the door 304 may be configured to abut the body 302 when the substrate support 306 is positioned within the processing volume 312. In one embodiment, the substrate support 306 is configured to move laterally. As a result, the distance 348 may be minimized because vertical movement of the substrate support 306 within the processing volume 312 is unnecessary. A seal 352, such as an o-ring or the like, may be coupled to the body 302 and the seal 352 may be formed from an elastomeric material, such as a polymeric material. Generally, the door 304 may be secured to the body 302 during processing via coupling apparatus (not shown), such as bolts or the like, with sufficient force to withstand a high pressure environment suitable to forming or maintaining a supercritical fluid in the processing volume 312.

The baffle plate 310 may be formed from various materials, including stainless steel, aluminum, ceramic materials, quartz materials, silicon containing materials, or other suitably configured materials. The baffle plate 310 may be coupled to an actuator 330 configured to move the baffle plate 310 towards and away from the substrate support 306. The actuator 330 may be coupled to a power source 328, such as an electrical power source to facilitate movement of the baffle plate 310 within the processing volume 312.

A substrate 308 may be positioned on the substrate support 306 during processing. In one embodiment, a device side 314 of the substrate 308 may be positioned adjacent to the substrate support 306 such that the device side 314 faces away from the baffle plate 310. In operation, the baffle plate 310 may be in a raised position when the substrate 308 is being positioned within the processing volume 312. The baffle plate 310 may be lowered via the actuator 330 to a processing position in close proximity with the substrate 308 during processing. After processing, the baffle plate 310 may be raised and the substrate support 306 may remove the substrate 308 from the processing volume 312 through the opening 350 in the body 302. It is believed that by positioning the baffle plate 310 in close proximity with the substrate 308 and the substrate support 306, particle deposition on the device side 314 of the substrate 308 may be reduced or eliminated during introduction of solvents and/or liquid/supercritical $CO_2$ to the processing volume 312.

Figure 4:
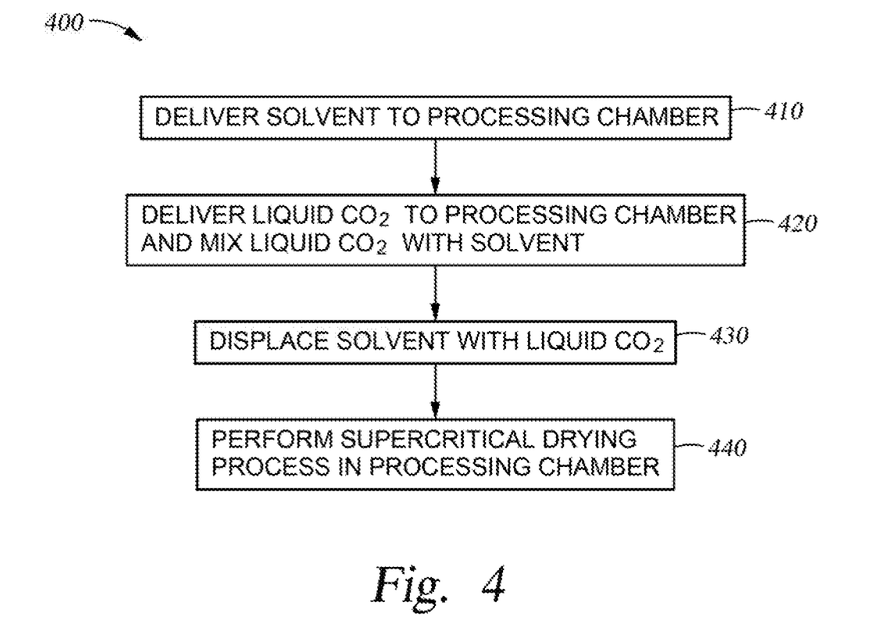
FIG. 4 illustrates operations of a method for performing a solvent displacement and supercritical drying process according to one embodiment described herein.

FIG. 4 illustrates operations of a method 400 for performing a solvent displacement and supercritical drying process according to one embodiment described herein. Generally, various pre-cleaning processes are performed prior to performing the method 400. Such pre-cleaning processes may be performed in the apparatus 200 and 200A as described above. At operation 410, a solvent may be provided to a processing chamber, such as the chamber 300. The solvent may be any of the solvents described above. In an exemplary embodiment, the solvent may be acetone which exhibits a relatively low viscosity and desirable miscibility with liquid $CO_2$. In certain embodiments, the acetone may be distilled, purified, and filtered prior to delivering the acetone to the processing chamber.

In one embodiment, the solvent may be provided to the processing chamber prior to introducing the substrate to the processing chamber. In another embodiment, the substrate may be positioned in the processing chamber and the solvent may be subsequently provided to the processing chamber. In both embodiments, the solvent may be provided to the processing volume 312 of the chamber 300 via one or more of the solvent sources 320, 332, 336. In an exemplary embodiment, the solvent may be provided in a "top-down" manner from the solvent source 320. Generally, the solvent may fill the processing volume 302 in an amount sufficient to completely submerse the substrate in solvent.

At operation 420, liquid $CO_2$ may be delivered to the chamber 300 and the liquid $CO_2$ may be mixed with the solvent. In one embodiment, the liquid $CO_2$ may be introduced to the processing volume 312 via the first fluid source 324. The liquid $CO_2$ may be delivered at a rate between about 300 ml/min and about 2.5 L/min, such as about 1 L/min. In one embodiment, the liquid $CO_2$ may be provided to the processing volume 312 which is maintained at a pressure of about 90 bar and about 110 bar, such as about 100 bar. A temperature of the processing volume 312 may be maintained at a temperature of between about 5° C. and about 30° C., such as about 20° C. during delivery of the liquid $CO_2$. The liquid $CO_2$ is generally provided in a manner that facilitates mixing of the liquid $CO_2$ and the solvent.

At operation 430, the solvent may be displaced with the liquid $CO_2$. In this embodiment, after the solvent and the liquid $CO_2$ have been sufficiently mixed, the solvent/liquid $CO_2$ may be flushed from the processing volume 312 via the fluid outlet 340. The displacement process may continue by providing additional liquid $CO_2$ to the processing volume 312. In one embodiment, an additional amount of liquid $CO_2$ suitable to perform the solvent displacement is between about 1 chamber volume and about 5 chamber volumes, such as about 3 chamber volumes. In other words, the processing volume 312 may be fully exchanged with liquid $CO_2$ multiple times. The solvent displacement process may be practiced to remove solvent from the substrate and high aspect ratio features formed on the substrate such that liquid $CO_2$ is predominantly present in the processing volume 312 after the operation 430.

At operation 440, a supercritical drying process may be performed in the processing chamber 300. The liquid $CO_2$ may be phase transitioned to a supercritical fluid by heating the processing volume 312. Generally, the pressure of the processing volume 312 may be maintained at a substantially constant pressure, such as about 100 bar, during the operations 410-440. The processing volume 312 may be heated to a temperature suitable to facilitate phase transition of the liquid $CO_2$ to supercritical $CO_2$. In one embodiment, the temperature of the processing volume 312 may be greater than about 31° C., such as between about 40° C. and about 50° C. In one embodiment, the phase transition from liquid to supercritical fluid may be performed in an amount of time between about 10 seconds and about 60 seconds, such as about 30 seconds. As a result, supercritical $CO_2$ may be formed in the processing volume 312.

Operation 440 also includes a supercritical drying process. The supercritical drying process ensures the supercritical $CO_2$ changes to a gaseous state without turning into a liquid. The fluids expelled from the high-aspect-ratio features during the supercritical drying process may exhibit a negligible surface tension due to the characteristics of the supercritical $CO_2$ which results in the reduction or elimination of line stiction. In one embodiment, the supercritical $CO_2$ at about 50° C. and about 95 bar undergoes isothermal depressurization at about 50° C. until the pressure drops to about 21 bar. In one embodiment, the supercritical drying process may be performed for an amount of time between about 1 minute and about 5 minutes, for example about 3 minutes. The gasses (i.e. gaseous $CO_2$) remaining in the processing volume 312 may be vented from the chamber 300 via the fluid outlet 340.

Figure 5:
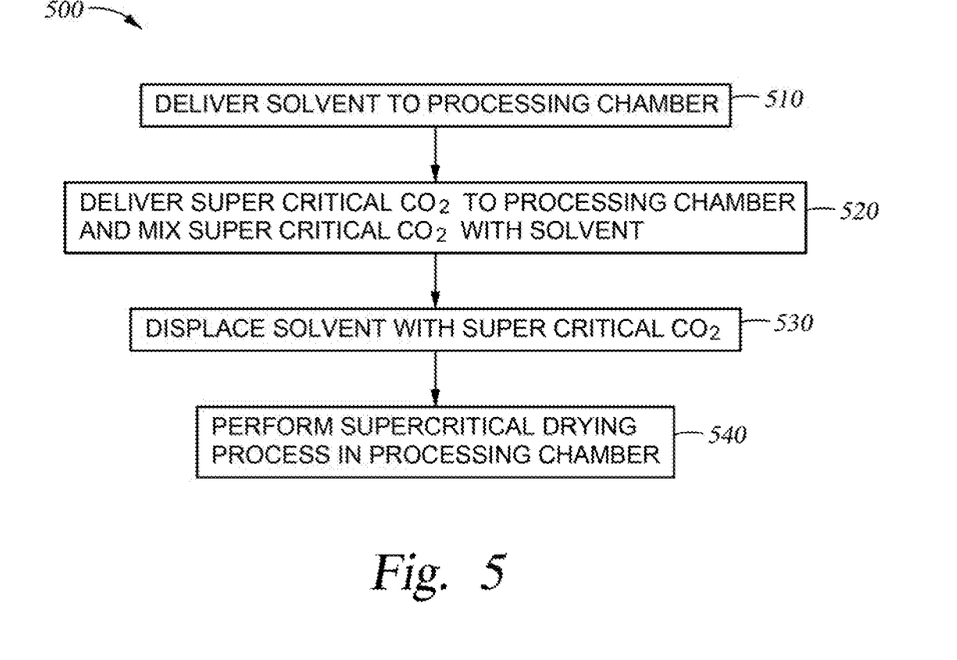
FIG. 5 illustrates operations of a method for performing a solvent displacement and supercritical drying process according to one embodiment described herein.

FIG. 5 illustrates operations of a method 500 for performing a solvent displacement and supercritical drying process according to one embodiment described herein. Similar to FIG. 4, various pre-cleaning processes may be performed prior to performing the method 500. At operation 510, a solvent may be delivered to the processing chamber. Operation 510 is similar to operation 410, the details of which may be found above with reference to FIG. 4.

At operation 520, supercritical $CO_2$ may be delivered to the processing chamber and the supercritical $CO_2$ may be mixed with the solvent. In one embodiment, the supercritical $CO_2$ may be introduced to the processing volume 312 via the first fluid source 324. In this embodiment, the first fluid source 324 may include various temperature and pressure apparatus to phase transition liquid $CO_2$ to supercritical $CO_2$ outside of the processing volume 312. In one embodiment, the supercritical $CO_2$ may be provided to the processing volume 312 which is maintained at a pressure of about 90 bar and about 110 bar, such as about 100 bar, such that the supercritical phase may be maintained within the processing volume. A temperature of the processing volume 312 may be maintained at a temperature of greater than about 31° C., such as between about 40° C. and about 50° C., during operation 520. The supercritical $CO_2$ is generally provided in a manner that facilitates mixing of the supercritical $CO_2$ and the solvent.

At operation 530, the solvent may be displaced with the supercritical $CO_2$. In this embodiment, after the solvent and the supercritical $CO_2$ have been sufficiently mixed, the solvent/supercritical $CO_2$ may be flushed from the processing volume 312 via the fluid outlet 340. The displacement process may continue by providing additional supercritical $CO_2$ to the processing volume 312. In one embodiment, an additional amount of supercritical $CO_2$ suitable to perform the solvent displacement is between about 1 chamber volume and about 5 chamber volumes, such as about 3 chamber volumes. In other words, the processing volume 312 may be fully exchanged with supercritical $CO_2$ multiple times. The solvent displacement process may be configured to remove solvent from the substrate and high aspect ratio features formed on the substrate such that supercritical $CO_2$ is predominantly present in the processing volume 312 after the operation 530.

At operation 540, a supercritical drying process may be performed. Similar to operation 440, the supercritical drying process of operation 540 ensures the supercritical $CO_2$ changes to a gaseous state without turning into a liquid. The fluids expelled from the high-aspect-ratio features during the supercritical drying process may exhibit a negligible surface tension due to the characteristics of the supercritical $CO_2$ which results in the reduction or elimination of line stiction. In one embodiment, the supercritical $CO_2$ at about 50° C. and about 95 bar undergoes isothermal depressurization at about 50° C. until the pressure drops to about 21 bar. In one embodiment, the supercritical drying process may be performed for an amount of time between about 1 minute and about 5 minutes, for example about 3 minutes. The gasses (i.e. gaseous $CO_2$) remaining in the processing volume 312 may be vented from the chamber 300 via the fluid outlet 340.

In addition to the methods 400, 500, it is contemplated that various combinations of the methods 400, 500 may be utilized together to perform solvent displacement and supercritical drying processes. For example, liquid $CO_2$ and supercritical $CO_2$ may be provided sequentially or simultaneously during the operations 420, 520. Similarly, liquid $CO_2$ and supercritical $CO_2$ may be provided sequentially or simultaneously during operations 430, 530.

In both methods 400, 500, the supercritical $CO_2$ exhibits properties intermediate between a gas and a liquid and has the ability to penetrate well into the intricate nano-geometries of high aspect ratio features, due to its gas-like transport behaviors, which can be effective in particle and residue removal due to its excellent mass-transfer capabilities commonly associated with flowing liquids. As a result of the creation of the supercritical phase, capillary pressure due to the difference between liquid-gas and liquid-solid surface tension is eliminated. The elimination of capillary pressure prevents bending and interaction of the clean surfaces, which may reduce the probability of stiction from occurring in the high aspect ratio features.

While the foregoing is directed to embodiments of the present disclosure, other and further embodiments of the disclosure may be devised without departing from the basic scope thereof, and the scope thereof is determined by the claims that follow.

What is claimed is:

1. A substrate processing method, comprising:
   delivering a solvent to a processing chamber having an insulation element disposed in a body thereof, the body defining a processing volume, the insulation element dividing a portion of the processing chamber body to create a liner therein, the body and the liner comprising a unitary structure, wherein the insulation element has a coefficient of thermal expansion similar to a coefficient of thermal expansion for materials utilized to fabricate the body and the liner, wherein the liner is in contact with the insulation element such that the liner is encased by the insulation element and separates the insulation element from the processing volume;
   delivering a substrate in a device side down orientation to the processing chamber;
   positioning a movable baffle plate moveably disposed within the processing chamber in close proximity to the substrate, the movable baffle plate configured to move from a raised position to a processing position through an actuator;
   delivering liquid $CO_2$ to the processing chamber and mixing the liquid $CO_2$ with the solvent to form a mixture;
   delivering additional liquid $CO_2$ to the processing chamber in an amount greater than a volume of the processing chamber to displace the mixture;
   phase transitioning the liquid $CO_2$ to supercritical $CO_2$ in the processing chamber; and
   drying the substrate by isothermally depressurizing the processing chamber and exhausting gaseous $CO_2$ from the processing chamber.

2. The method of claim 1, wherein the solvent is miscible with liquid $CO_2$.

3. The method of claim 2, wherein the solvent is selected from the group consisting of acetone, isopropyl alcohol, ethanol, methanol, N-Methyl-22-pyrrolidone, N-Methylformamide, 1,3-Dimethyl-2-imidazolidinone, dimethylacetamide, and dimethyl sulfoxide.

4. The method of claim 1, further comprising delivering supercritical $CO_2$ to the processing chamber.

5. The method of claim 1, wherein the phase transitioning the liquid $CO_2$ to supercritical $CO_2$ in the processing chamber comprises delivering supercritical $CO_2$ to the processing chamber, wherein phase transitioning the liquid $CO_2$ to supercritical $CO_2$ in the processing chamber further comprises heating the processing volume of the processing chamber from 20° to 50° in less than 1 minute.

6. A substrate processing method, comprising:
   delivering a solvent miscible with liquid $CO_2$ to a processing chamber, the processing chamber having an insulation element disposed in a body thereof, the body defining a processing volume, the insulation element dividing a portion of the processing chamber body to create a liner therein, the body and the liner comprising a unitary structure, wherein the insulation element has a coefficient of thermal expansion similar to a coefficient of thermal expansion for materials utilized to fabricate the body and the liner, wherein the liner is in contact with the insulation element such that the liner is encased by the insulation element and separates the insulation element from the processing volume;
   delivering a substrate in a device side down orientation to the processing chamber;
   positioning a movable baffle plate moveably disposed within the processing chamber in close proximity to the substrate, the movable baffle plate configured to move from a raised position to a processing position through an actuator;
   delivering supercritical $CO_2$ to the processing chamber and mixing the supercritical $CO_2$ with the solvent;
   delivering additional supercritical $CO_2$ to the processing chamber in an amount greater than a volume of the processing chamber to displace the solvent; and
   drying the substrate by isothermally depressurizing the processing chamber and exhausting gaseous $CO_2$ from the processing chamber.

7. The method of claim 6, wherein the solvent is selected from the group consisting of acetone, isopropyl alcohol, ethanol, methanol, N-Methyl-2-pyrrolidone, N-Methylformamide, 1,3-Dimethyl-2-imidazolidinone, dimethylacetamide, and dimethyl sulfoxide.

8. The method of claim 6, further comprising phase transitioning the liquid $CO_2$ to supercritical $CO_2$ in the processing chamber by delivering supercritical $CO_2$ to the processing chamber.

9. The method of claim 6, wherein the solvent is acetone and the solvent is provided to the processing chamber in an amount configured to at least partially submerge the substrate.

10. The method of claim 8, wherein the phase transitioning the liquid $CO_2$ to supercritical $CO_2$ in the processing chamber further comprises heating the processing volume of the processing chamber from 20° C. to 50° C. in less than 1 minute.

11. The method of claim 6, wherein the amount of additional supercritical $CO_2$ is between 1 and 5 times the volume of the processing volume.

12. The method of claim 10, wherein a pressure of the processing chamber is maintained at a constant level during the heating a processing volume.

13. The method of claim 6, wherein drying the substrate comprises converting a supercritical $CO_2$ to gaseous $CO_2$ without forming liquid $CO_2$.

14. The method of claim 8, wherein the phase transitioning the liquid $CO_2$ to supercritical $CO_2$ in the processing chamber while delivering supercritical $CO_2$ to the processing chamber comprises heating the processing volume of the processing chamber from 20° C. to 50° C. in less than 1 minute.

15. A substrate processing method, comprising:
   delivering a solvent miscible with liquid $CO_2$ to a processing chamber having an insulation element disposed in a body thereof, the body defining a processing volume, the insulation element dividing a portion of the processing chamber body to create a liner therein, the body and the liner comprising a unitary structure, wherein the insulation element has a coefficient of thermal expansion similar to a coefficient of thermal expansion for materials utilized to fabricate the body and the liner, wherein the liner is in contact with the insulation element such that the liner is encased by the insulation element and separates the insulation element from the processing volume;

delivering a substrate in a device side down orientation to the processing chamber;

positioning a movable baffle plate moveably disposed within the processing chamber in close proximity to the substrate, the movable baffle plate configured to move from a raised position to a processing position through an actuator;

delivering liquid $CO_2$ to the processing chamber and mixing the liquid $CO_2$ with the solvent;

delivering additional liquid $CO_2$ to the processing chamber in an amount greater than a volume of the processing chamber to displace the solvent;

phase transitioning the liquid $CO_2$ to supercritical $CO_2$ in the processing chamber while delivering supercritical $CO_2$ to the processing chamber; and drying the substrate by isothermally depressurizing the processing chamber and exhausting gaseous $CO_2$ from the processing chamber.

16. The method of claim 15, wherein the solvent is selected from the group consisting of acetone, isopropyl alcohol, ethanol, methanol, N-Methyl-2-pyrrolidone, N-Methylformamide, 1,3-Dimethyl-2-imidazolidinone, dimethylacetamide, and dimethyl sulfoxide.

17. The method of claim 15, wherein the solvent is acetone and the solvent is provided to the processing chamber in an amount configured to at least partially submerge the substrate.

* * * * *